United States Patent [19]
Pohribnij et al.

[11] Patent Number: 5,872,455
[45] Date of Patent: Feb. 16, 1999

[54] WRIST STRAP TEST MODE CIRCUITRY

[75] Inventors: Walter Jerry Pohribnij, Palatine; Warren E. Guthrie, Wheaton; Michael J. Trainor, Palatine, all of Ill.

[73] Assignee: Northrop Grumman Corporation, Los Angeles, Calif.

[21] Appl. No.: 857,606

[22] Filed: May 16, 1997

[51] Int. Cl.⁶ .......................... G01R 31/02; G08B 21/00; H05F 3/02
[52] U.S. Cl. .......................... 324/509; 324/457; 324/510; 361/220; 340/649
[58] Field of Search .................................. 324/509, 452, 324/454, 456, 457, 510; 340/649, 650; 361/212, 220

[56] References Cited

U.S. PATENT DOCUMENTS

| | | | |
|---|---|---|---|
| 4,155,116 | 5/1979 | Tawfik et al. | 364/119 |
| 4,509,531 | 4/1985 | Ward | 128/736 |
| 4,589,275 | 5/1986 | Thomas et al. | 73/40.5 R |
| 4,638,399 | 1/1987 | Maroney et al. | 361/220 |
| 4,710,751 | 12/1987 | Webster | 361/220 |
| 4,745,519 | 5/1988 | Breidegam | 361/220 |
| 4,800,374 | 1/1989 | Jacobson | 324/509 |
| 4,802,163 | 1/1989 | Hirabayashi | 371/15 |
| 4,858,125 | 8/1989 | Washizuka et al. | 364/413.01 |
| 4,859,992 | 8/1989 | Hoigaard | 324/509 |
| 4,952,928 | 8/1990 | Carroll et al. | 340/825.54 |
| 5,051,732 | 9/1991 | Robitaille | 324/510 |
| 5,083,117 | 1/1992 | Hoigaard | 324/510 |
| 5,218,306 | 6/1993 | Bakhoum | 324/509 |
| 5,337,290 | 8/1994 | Ventimiglia et al. | 368/10 |
| 5,408,186 | 4/1995 | Bakhoum | 324/509 |
| 5,430,735 | 7/1995 | Sauerwald et al. | 371/22.3 |
| 5,430,940 | 7/1995 | Lym | 30/146 |
| 5,461,369 | 10/1995 | Campbell et al. | 324/457 |
| 5,519,384 | 5/1996 | Chanudet et al. | 324/509 |
| 5,686,897 | 11/1997 | Loh | 324/509 |

*Primary Examiner*—Diep N. Do
*Attorney, Agent, or Firm*—Terry J. Anderson; Karl J. Hoch, Jr.

[57] ABSTRACT

Improved electronic circuitry incorporated into a tag attached to a user worn wrist strap of a static electrical discharge dissipation system. The electronic circuitry monitors the electrical connection of the wrist strap from the user to ground and tests the functionality of the tag. The electronic circuitry comprises an oscillator, a signal transmitter, a discharge resistor and a discharge resistor check circuit for monitoring the accuracy of the discharge resistor. The electronic circuitry also comprises a skin resistance check circuit for monitoring the electrical connection of the wrist strap to the user, and a ground fault detect circuit for monitoring the electrical connection of the wrist strap to ground. The electronic circuitry further comprises a testing circuit for checking the frequency of the oscillator, monitoring the spectrum of a signal transmitted by the signal transmitter, checking the functionality of the ground fault detect circuit, checking low and high limits of the discharge resistor, and checking the functionality of the skin resistance check circuit.

27 Claims, 5 Drawing Sheets

| OPERATION | | SW1 | SW2 | SW3 | SW6 | SW7 | SW8 | SW10 |
|---|---|---|---|---|---|---|---|---|
| GND MONITOR | | GND | GND | OC | OC | OC | INT | GND |
| DISCHARGE RESISTOR CHECK LOW LIMIT | | GND | +V | COMP | OC | OC | GND | GND |
| DISCHARGE RESISTOR CHECK HIGH LIMIT | | +V | GND | COMP | OC | OC | GND | GND |
| WRIST CHECK | | OC | OC | +V | CL | CL | +V | OC |

Fig. 6

| Device | Function |
|---|---|
| Test Switch | Advances test algorithm to the next test |
| CLR Switch | Clears and resets the tag microprocessor |
| Discharge Test Switch | Selects test resistance for discharge resistance test |
| Wrist Test Switch | Selects test resistance for wrist resistance test |
| Ground Test Switch | Connects/disconnects ground for ground detect test |
| Tag Power Switch | Enables/disables power to the tag |
| Power Switch | Enables/disables power to the test fixture |
| Ground Jack | Connects ground sensing circuit to gnd test circuit |
| Buzzer | Connects to buzzer that emits tones indicating sensor status |
| V+ | Power supply to the tag |
| Gnd | Ground connection to the tag and test fixture |

Fig. 7

WRIST STRAP TEST MODE CIRCUITRY

FIELD OF THE INVENTION

The present invention relates generally to static electrical charge dissipation devices, and more particularly to a static wrist strap which includes electronic circuitry adapted to monitor various sensors of the wrist strap and transmit the information back to a central location. The electronic circuitry is also adapted to initiate a test mode after the assembly of the static wrist strap to enable the testing thereof.

BACKGROUND OF THE INVENTION

For some time, the prior art has recognized the need to minimize static electrical charges in certain laboratory and manufacturing environments. The build-up of static electrical charges on sensitive items, including electronic components such as integrated circuit chips, may result in the catastrophic failure of such items. These highly sensitive items are particularly susceptible to damage from static electrical charges during manufacturing and assembly processes wherein the electrical leads of such items are typically exposed and unshielded. Once installed in the devices for which they are intended, such items are generally less susceptible to damage from static electrical charges, since they are substantially isolated therefrom and frequently grounded in a manner which prevents static electrical charge build-up.

In accordance with contemporary methodology, various means are utilized to mitigate the undesirable effects of static electrical charge build-up in the laboratory or manufacturing environment. For example, the manufacturing and assembly of static sensitive devices is typically conducted in an environmentally controlled facility which is adapted to minimize electrostatic charge build-up. Frequently, the humidity within the facility is maintained within a desirable range such that static charges tend to dissipate, through the moisture ladened air, from the surfaces upon which such charges would otherwise accumulate. Additionally, it is also known to increase the ion content of the air within sensitive areas of such facilities so as to provide a means for neutralizing undesirable static electrical charges. The ions from the air combine with those of an opposite charge which define the undesirable static electrical charges, thus effecting the neutralization of such charges.

In addition to the foregoing, workers in the above-described facilities are generally required to utilize grounding straps upon one of their wrists and/or ankles, and are also often required to wear static charge dissipating clothing, e.g., gowns and/or other articles of clothing, so as to mitigate static charge build-up upon the person and/or their clothing. As used herein, the term wrist strap shall be defined to include such wrist straps, ankle straps, and/or other personnel grounding devices.

One such prior art wrist strap comprises a single line grounding strap which utilizes a single conductive line to bleed static electrical charges away from the user to ground. A resistor is preferably incorporated into the conductive line to ground so as to prevent a direct short to ground if the user should accidentally contact a hot or active electrical conductor. Thus, the inclusion of the resistor within the conductive line substantially enhances the safety of the wrist strap.

In these prior art wrist straps, it is known to continuously monitor the integrity of the conductive path to ground by monitoring the capacitance of the conductive line. In this respect, the capacitance of the conductive line is substantially reduced when the electrical connection of the wrist strap to the user is not adequate, i.e., an open or high resistance connection is present. The integrity of the conductive path may also be monitored in the prior art wrist straps by measuring continuity on an intermediate basis. However, such monitoring requires that the user periodically touch a ground so as to define a current loop through the conductive line, the user, and ground, through which continuity is measured. In the prior art wrist straps, the integrity of the conductive path is also monitored by monitoring the electrical connection of the wrist strap to ground.

To achieve the aforementioned functional attributes, prior art wrist straps are often provided with a capacitance circuit for monitoring the electrical connection of the wrist strap to the user by monitoring the capacitance of the conductive line. As previously indicated, the capacitance of the conductive line is dependent upon the presence of a user, as well as the integrity of the conductive line connection to the user via the wrist strap. In addition to the capacitance circuit, the prior art wrist straps are often provided with a resistance circuit which monitors the electrical connection of the wrist strap to ground, thus insuring the presence of an adequate ground to which electrical charges are bled from the user. These prior art wrist bands, the user is typically alerted when electrical continuity through the wrist strap to ground is degraded. Thus, if any portion of the conductive path from the user to ground is not adequate to properly bleed off static electrical charge build-up upon the user, the user is alerted via a visual and/or audible alarm.

Though serving their intended purpose of bleeding static electrical charges from a user to ground, the prior art wrist bands possess certain deficiencies which detract from their overall utility. Though such wrist bands include circuits for monitoring the electrical connections of the wrist band to the user and the conductive line to ground, they do not include a circuit for monitoring the discharge resistor which, as previously indicated, is often incorporated in the conductive line to enhance the safety of the wrist strap. Additionally, the circuitry incorporated in the prior art wrist straps is extremely complex, thus causing the size of the wrist straps to be extremely large. The prior art circuitry also necessitates increased power input which significantly reduces the life of the battery incorporated into the wrist strap. Moreover, the prior art wrist straps, subsequent to being built, must be subjected to a complicated and time consuming test process which requires the use of a highly specialized text fixture.

SUMMARY OF THE INVENTION

The previously described deficiencies of the prior art wrist straps are overcome by the present invention. The present invention comprises a static wrist strap having an inexpensive radio transmitter (hereinafter referred to as a "tag") attached thereto or placed into electrical communication therewith. The tag includes electronic circuitry adapted to monitor various sensors and transmit the information back to a central location. The tag contains a microprocessor which determines when the sensors are to be checked and when the status of the sensors is to be transmitted to the central location. The microprocessor is implemented such that it includes a test mode that enables testing of the tag after assembly. The test may be automated for production, and enables quick testing of the tag subsequent to its assembly. The unique circuitry of the present tag allows the same to conduct several different tests by multiplexing parts of the circuitry. Incorporated into the microprocessor of the present tag are two (2) comparators and additional circuitry which accomplish tasks that ordinarily take three (3) to four (4) comparators and some additional circuitry. The circuitry of the present tag also provides for the transmission of the monitored sensor information to the central location.

The unique electronic circuitry of the present tag monitors the ground connection for interrupts/failures to insure the integrity of the conductive path from the tag to ground. The electronic circuitry also monitors the skin resistance of the operator or user (which is preferably below 10 Megohms) to insure electrical connection between the electrodes of the tag (e.g., wrist strap) and the user's skin. To insure user safety, the discharge resistor of the tag (which preferably has a value of 1 Megohm +/−30%) is also monitored by the electronic circuitry, with such monitoring being accomplished in two (2) steps, i.e., by separately checking the high limit and the low limit of the discharge resistor.

The uniqueness of the electronic circuitry incorporated into the tag is that it enables the microprocessor of the tag to conduct several tests without requiring the use of a larger microprocessor with more input/output pins and/or the use of more extensive external circuitry. The use of the smallest microprocessor possible and the rapid switching between tests allows for the minimization of the amount of power used by the microprocessor. This helps to maintain a reasonable battery life, using a relatively small battery. As such, the efficiency of the monitoring/test algorithms allows for the miniaturization of the tag, while still maintaining desired functionality.

More particularly, the present invention comprises electronic circuitry which is incorporated into the user worn tag of a static electrical discharge dissipation system wherein the tag is electrically connected to ground via a conductive line. The electronic circuitry of the present invention is adapted to monitor the electrical connection of the tag from the user to ground and test the functionality of the tag. The electronic circuitry comprises an oscillator, a signal transmitter, a discharge resistor and a discharge resistor check circuit for monitoring the accuracy of the discharge resistor. In addition to the discharge resistor check circuit, the electronic circuitry comprises a skin resistance check circuit for monitoring the electrical connection of the tag to the user, and a ground fault detect circuit for monitoring the electrical connection of the tag to ground. The discharge resistor check circuit is itself configured to perform separate high and low limit checks of the discharge resistor. In the preferred embodiment, the discharge resistor check circuit, skin resistance check circuit, and ground fault detect circuit are each integrated into a sensor circuit of the electronic circuitry. The sensor circuit is itself incorporated into a microprocessor of the electronic circuitry, with the tag into which the electronic circuitry is incorporated preferably being integrated into or placed into electrical communication with a static wrist strap. However, those of ordinary skill in the art will recognize that the tag of the present invention may be used in conjunction with devices other than for wrist straps (e.g., ankle straps).

In the preferred embodiment, the electronic circuitry further includes a testing circuit for checking the frequency of the oscillator, monitoring the spectrum of a signal transmitted by the signal transmitter, checking the functionality of the ground fault detect circuit, checking a low limit of the discharge resistor, checking a high limit of the discharge resistor, and checking the functionality of the skin resistance check circuit. Like the sensor circuit, the testing circuit is itself incorporated into the microprocessor of the electronic circuitry.

The testing circuit of the electronic circuitry is preferably configured to conduct a series of tests. These tests include a first test wherein the oscillator (an RF oscillator) is caused to generate or output a continuous sequence or tone (i.e., CW frequency) for allowing the frequency of the oscillator to be checked and properly tuned. The continuous sequence preferably comprises a 2.414 GHz +/−20 kHz signal at 0 dBm having a 1s modulation. As such, the performance of the first test allows the oscillator to be tuned to the proper frequency. In addition to the first test, the testing circuit conducts a second test wherein the signal transmitter is caused to transmit a signal to enable the spectrum of the transmitted signal to be monitored. The signal transmitted by the signal transmitter is preferably a direct sequence spread spectrum (DSSS) signal having a main lobe of a width of approximately 1 MHz. As such, the performance of the second test allows for a broad transmit fidelity check. The testing circuit also conducts a third test wherein the ground fault detect circuit is enabled to monitor the response of the tag to ground and no ground. As will be described in more detail below, the third test is conducted through the use of a switch.

In addition to the aforementioned tests, the testing circuit conducts a fourth test wherein the discharge resistor check circuit is enabled to allow the low limit of the discharge resistor to be checked. In this respect, the fourth test is used to verify that the value of the discharge resistor is above its low limit of 700 kohm. The testing circuit also conducts a fifth test wherein the discharge resistor check circuit is enabled to allow the high limit of the discharge resistor to be checked. The fifth test is used to verify that the value of the discharge resistor is less than its high limit of 1.3 Megohm. As such, the performance of the fourth and fifth tests verify the accuracy of the discharge resistor of the electronic circuitry to 1 Megohm +/−30%. Finally, the testing circuit conducts a sixth test wherein the skin resistance check circuit is enabled to allow a maximum skin resistance detect to be tested. The performance of the sixth test ensures that the skin resistance check circuit monitoring the operator's skin resistance is functional, and that the skin resistance of the operator wearing the wrist strap into which the tag is preferably incorporated is less than 8 Megohm. Like the third test, the fourth, fifth and sixth tests are also performed through the use of a switch, as will also be described in more detail below.

In the preferred embodiment, the six tests are performed subsequent to the placement of the tag into a testing fixture by applying a proper voltage to the microprocessor which causes the same to go into its test mode activating the testing circuit. All six tests are run in this test mode, with the pressing of a button or the pulsing of a pin with an automated signal facilitating the advancement of the test mode to the next test. The order of the tests conducted by the testing circuit of the electronic circuitry is subject to change. The test sequence of the electronic circuitry may be automated to allow for quick testing of the tag without all of the mechanical interfaces and complicated test fixtures that may require operators to conduct such testing. As previously indicated, the testing circuit is incorporated into the microprocessor into which the sensor circuit is incorporated, thus allowing the microprocessor to go into the test mode and eliminating the need for a larger microprocessor with more inputs and outputs to perform such tests. As will be recognized, a larger microprocessor would be physically larger and would likely consume more current. Thus, the present microprocessor incorporating the testing circuit helps reduce the amount of testing required for the tag, while still ensuring reliable operation. As such, the design saves money for manufacturing and testing, while not increasing the cost of the electronic circuitry or greatly increasing the complexity thereof.

In the electronic circuitry of the present invention, the discharge resistor check circuit is configured to generate a discharge resistor signal, with the skin resistance check circuit being configured to generate a skin resistance signal. Similarly, the ground fault detect circuit is configured to generate a ground fault signal. The discharge resistor, skin resistance, and ground fault signals are transmitted to an interrogator unit via a transmission circuit which is preferably included in the electronic circuitry. The transmission circuit is itself configured to transmit the discharge resistor, skin resistance, and ground fault signals via a direct sequence spread spectrum having a data rate of approximately 33.33 kbps. Additionally, these signals are preferably transmitted by the transmission circuit to the interrogator unit at selected transmission cycles, and via a preferred carrier frequency of approximately 2414 Mhz +/-1 Mhz. Each of the transmission cycles preferably comprises approximately five repetitions of the signals, with each repetition being separated by a random interval of approximately three seconds. Further, the transmission circuit is configured such that the transmission cycles preferably occur at random intervals of approximately five minutes. The transmission circuit is also configured to transmit the ground fault signal to the interrogator unit immediately upon the occurrence of an interrupt within the electrical connection of the tag to ground. The tag (e.g., wrist strap) into which the present electronic circuitry is incorporated will typically comprise a "transmit only" (TO) tag. However, those of ordinary skill in the art will recognize that the electronic circuitry may also be incorporated into a "transmit then receive" (TTR) tag as well.

In the preferred embodiment, the discharge resistor check circuit of the electronic circuitry is configured to periodically monitor the accuracy of the discharge resistor, with the skin resistance check circuit being configured to periodically monitor the electrical connection of the tag to the user. However, the ground fault detect circuit is configured to continuously monitor the electrical connection of the tag to ground.

The electronic circuitry of the present invention further comprises an alarm circuit for generating an audible alarm in response to certain conditions sensed by the electronic circuitry. In the preferred embodiment, the alarm circuit is configured to generate an audible alarm when the accuracy of the discharge resistor as monitored by the discharge resistor check circuit is outside the range of approximately 1 Megohm +/-30%. The alarm circuit is also configured to generate an audible alarm when at least one, and preferably several, readings of the user's skin resistance as monitored by the skin resistance check circuit is above 8 Megohms, or when a ground fault condition is monitored by the ground fault detect circuit.

Further in accordance with the present invention, there is provided a method for monitoring the electrical connection of a user worn tag from the user to ground and testing the functionality of the tag. The method comprises the initial step of providing electronic circuitry which is incorporated into the tag and includes an oscillator, a signal transmitter, and a discharge resistor. The method further comprises the steps of monitoring the accuracy of the discharge resistor via a discharge resistor check circuit of the electronic circuitry, monitoring the electrical connection of the tag to the user via a skin resistance check circuit of the electronic circuitry, and monitoring the electrical connection of the tag to ground via a ground fault detect circuit of the electronic circuitry. The discharge resistor accuracy monitoring step is conducted by performing separate high and low limit checks of the discharge resistor. In addition to the aforementioned steps, the method also includes the steps of checking the frequency of the oscillator via a testing circuit of the electronic circuitry, monitoring the spectrum of a signal transmitted by the signal transmitter via the testing circuit, checking the functionality of the ground fault detect circuit via the testing circuit, checking a low limit of the discharge resistor via the testing circuit, checking a high limit of the discharge resistor via the testing circuit, and checking the functionality of the skin resistance check circuit via the testing circuit.

In the preferred method, the oscillator is caused to generate a continuous sequence preferably comprising a 2.414 GHz +/-20 kHz signal at 0 dBm having a 1s modulation for allowing the frequency of the oscillator to be checked and properly tuned. Additionally, the signal transmitter is caused to transmit a direct sequence spread spectrum signal having a main lobe of a width of approximately 1 MHz to allow the spectrum of the signal to be monitored. The ground fault detect circuit is also enabled to monitor the response of the tag to ground and no ground, with the discharge resistor check circuit being enabled to allow both the low and high limits of the discharge resistor to be checked. Further, the skin resistance check circuit is enabled to allow a maximum skin resistance detect to be tested. The low limit of the discharge resistor is approximately 700 kohm, with the high limit of the discharge resistor being approximately 1.3 Megohm and the maximum skin resistance detect being approximately 8 Megohm.

The preferred method further comprises the step of transmitting a discharge resistor signal generated by the discharge resistor check circuit, a skin resistance signal generated by the skin resistance check circuit, and a ground fault signal generated by the ground fault detect circuit to an interrogator unit via a transmission circuit of the electronic circuitry. These signals are preferably transmitted from the transmission circuit to the interrogator unit at selected transmission cycles via a carrier frequency of approximately 2414 Mhz +/-1 Mhz. The transmission cycles preferably occur at random intervals of approximately five minutes, with each of the transmission cycles preferably comprising approximately five repetitions of the signals, with each repetition being separated by a random interval of approximately three seconds.

The present method further comprises the step of generating an audible alarm in response to certain conditions of the electronic circuitry via an alarm circuit of the electronic circuitry. An audible alarm is generated when the accuracy of the discharge resistor as monitored by the alarm circuit is outside of the range of 1 Megohm +/-30%. An audible alarm is also generated when at least one, and preferably several, readings of the user's skin resistance as monitored by the skin resistance check circuit is above 8 Megohms, or when a ground fault is monitored by the ground fault detect circuit.

BRIEF DESCRIPTION OF THE DRAWINGS

These, as well as other features of the present invention, will become more apparent upon reference to the drawings wherein:

FIG. 6 is a table outlining the states that the switches and comparators of the electrical circuits shown in FIGS. 2–5 are in during the various tests conducted in the electronic circuitry of the tag constructed in accordance with the present invention; and FIG. 7 is a table outlining the components and related functions of the test fixture in which the tag constructed in accordance with the present invention is preferably tested.

DETAILED DESCRIPTION OF THE PREFERRED EMBODIMENT

Figure 1:
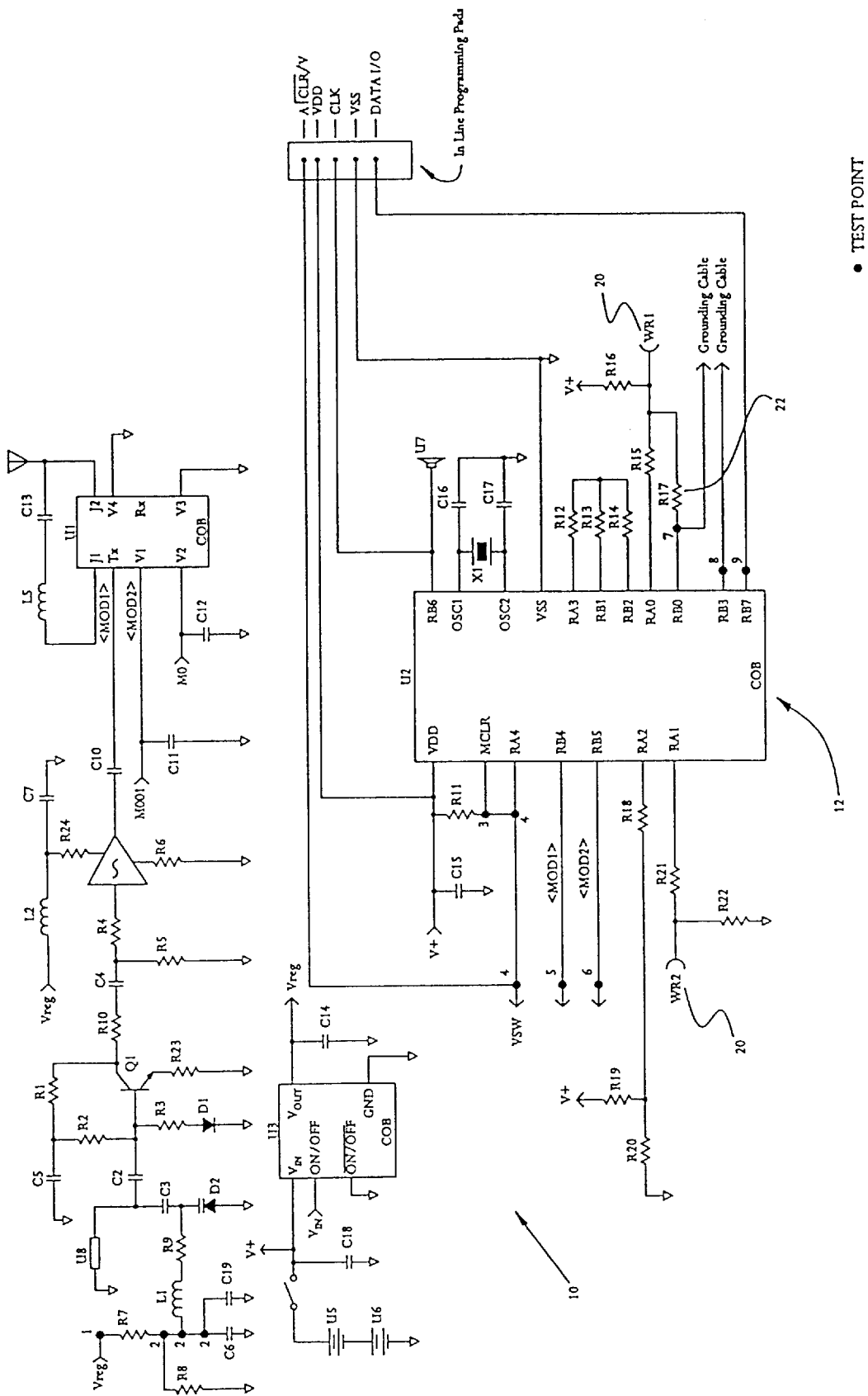
FIG. 1 is a complete electrical schematic of the tag constructed in accordance with the present invention.

Referring now to the drawings wherein the showings are for purposes of illustrating a preferred embodiment of the present invention only, and not for purposes of limiting the same, FIG. 1 schematically illustrates the complete electronic circuitry 10 constructed in accordance with the present invention. The electronic circuitry 10 is preferably incorporated into a "tag", and more particularly a "transmit only" (TO) tag. However, the electronic circuitry 10 may alternatively be incorporated into a "transmit then receive" (TTR) tag. The tag including the electronic circuitry 10 of the present invention is itself intended for use in conjunction with a selected radio frequency identification system protocol. As will be discussed in more detail below, TO tags including the electronic circuitry 10 are adapted to transmit a burst of direct sequence spread spectrum (DSSS) data at 33.33 kbps with random intervals. The data package consists of a tag identification and a status of various sensors. TTR tags including the electronic circuitry 10 are adapted to transmit a data package similar to tags, but are put into a receive mode following any transmissions. The receive mode facilitates the storage of data into the TTR tag memory for later extraction, initiating data retrieval, and initiating a variety of special functions.

As previously indicated, the electronic circuitry 10 of the present invention in preferably incorporated into a TO tag. The TO tag, which will hereinafter be referred to simply as the "tag", itself is preferably attached to or placed into electrical communication with an electrical discharge dissipation device such as a static wrist strap which is typically worn about the wrist of a user. In a preferred application, the wrist strap including the tag comprises part of a static electrical discharge dissipation system wherein the wrist strap is electrically connected to ground via a conductive line. In this respect, when the wrist strap is worn by the user, static electrical charges building up on the user's skin surface are bled to ground via the conductive line. Those of ordinary skill in the art will recognize that the tag may alternatively be attached to or placed into electrical communication with an ankle strap or a dissipation device which contacts another part of the user's body.

The electronic circuitry 10 of the tag is adapted to monitor various sensors and transmit the information back to a central location, and more particularly to an interrogator unit. The electronic circuitry 10 of the tag contains a microprocessor 12 which determines when the sensors of the tag are to be checked and when the status of the sensors is to be transmitted to the interrogator unit. The tag is adapted to conduct several different tests by multiplexing parts of the electronic circuitry 10. Incorporated into the microprocessor 12 are first and second comparators 14, 16, respectively, and additional circuitry which collectively accomplish tasks that ordinarily take three to four comparators and some additional circuitry. The electronic circuitry 10 of the tag also provides for the transmission of the monitored sensor information to the interrogator unit.

As will also be described in more detail below, the electronic circuitry 10 monitors the ground connection of the wrist strap to ground for interrupts or failures to insure the integrity of the conductive path from the wrist strap to ground. The electronic circuitry 10 also monitors the skin resistance of the user to insure electrical connection between the electrodes of the wrist strap and the user's skin. Additionally, to insure user safety, the tag includes a discharge resistor, the accuracy of which is also monitored by the electronic circuitry 10 by separately checking the high and low limits thereof.

In addition to the discharge resistor, the tag includes an oscillator and a signal transmitter. In this respect, the electronic circuitry 10 is also configured to test the functionality of the tag subsequent to its assembly. More particularly, the electronic circuitry 10 is configured to check the frequency of the oscillator and monitor the spectrum of a signal transmitted by the signal transmitter. The electronic circuitry 10 is also configured to check the functionality of that portion of the electronic circuitry 10 which ensures the integrity of the conductive path from the wrist strap to ground, check that portion of the electronic circuitry 10 which monitors the accuracy of the discharge resistor (i.e., checks the high and low limits thereof), and check the functionality of that portion of the electronic circuitry 10 which ensures electrical connection between the electrodes of the wrist strap and the user's skin.

As previously explained, the uniqueness of the electronic circuitry 10 incorporated into the tag is that it enables the microprocessor 12 to conduct several tests without requiring the use of a larger microprocessor with more input/output pins and/or the use of more extensive external circuitry. The use of the smallest microprocessor possible and the rapid switching between tests allows for the minimization of the amount of power used by the microprocessor 12. This helps to maintain a reasonable battery life, using a relatively small battery. As such, the efficiency of the monitoring/test algorithms allows for the miniaturization of the tag, while still maintaining desired functionality.

Figure 2:
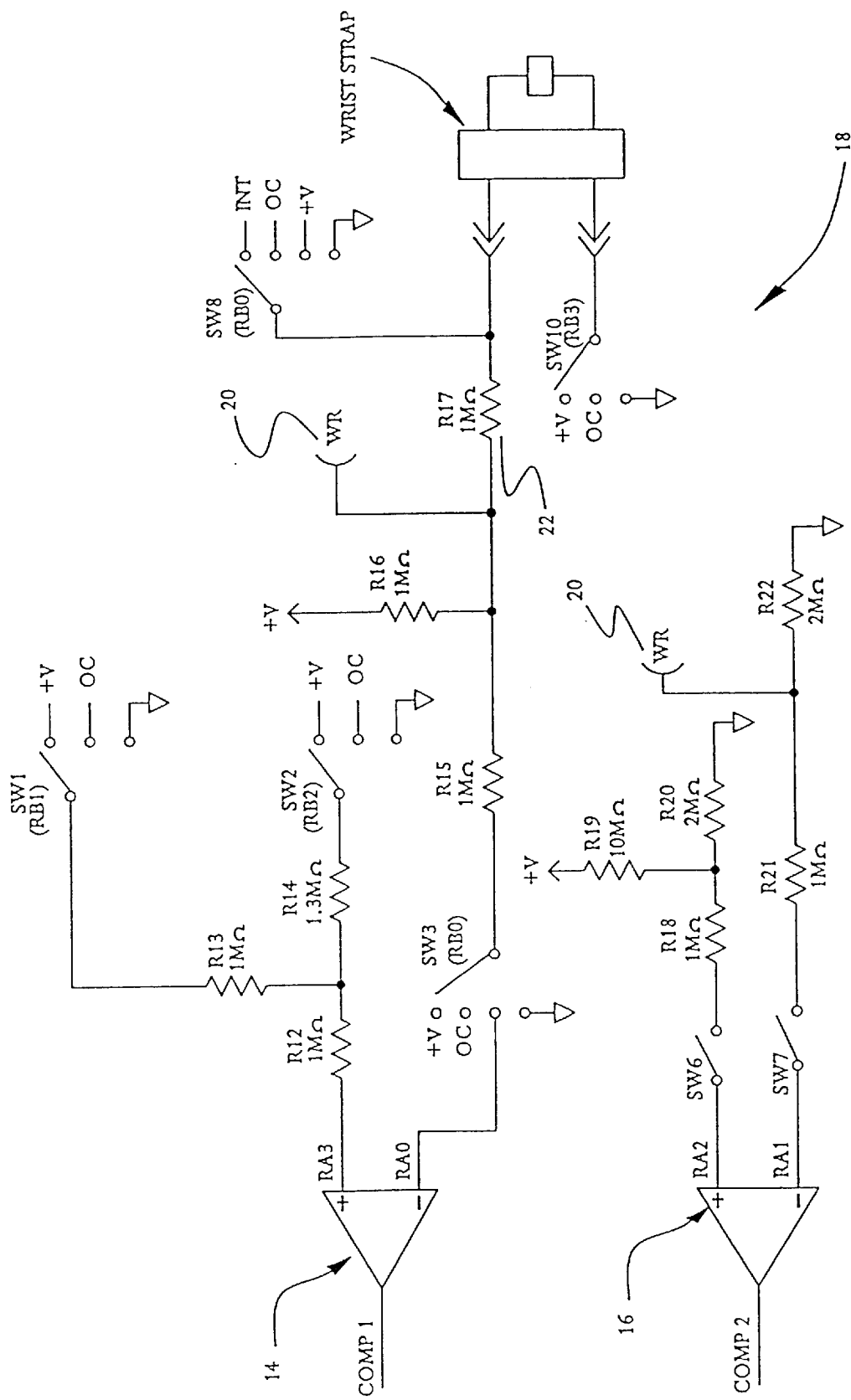
FIG. 2 is an electrical schematic of the sensor circuitry incorporated into the tag of the present invention.

Referring now to FIG. 2, schematically illustrated is a sensor circuit 18 of the electronic circuitry 10 which is internal to the microprocessor 12. The sensor circuit 18 includes the first comparator 14 and the second comparator 16, each of which are electrically connectable to a respective electrode 20 of the wrist strap. The electrodes 20 are intended to be placed into direct contact with the user's skin when the wrist strap is worn by the user. As previously indicated, the first and second comparators 14, 16, as well as all of the switches within the sensor circuit 18, are internal to the microprocessor 12, with all other components of the sensor circuit 18 being discrete parts. Additionally, as seen in FIG. 2, all connections to the microprocessor 12 are designated with a pin designation "RA#" or "RB#". The microprocessor 12 has the ability to connect each of the connections to an open circuit, a logical high (approximately 4.5 V), a logical low (approximately ground), a comparator input (i.e., RA0, RA1, RA2, and RA3), and an edge detecting hardware interrupt (i.e., RB0).

In the preferred embodiment, the sensor circuit 18 of the electronic circuitry 10 includes a discharge resistor 22 which is adapted to enhance the safety of the wrist strap when worn by the user. In this respect, the discharge resistor 22 prevents a direct short to ground if the user wearing the wrist strap accidentally contacts a hot or active electrical conductor. As will be explained below, the sensor circuit 18 of the electronic circuitry 10 is adapted to perform three specific tag sensing functions. These functions include a skin resistance sensing function which is used to verify that there is a low resistance connection from the wrist strap to the user, a discharge resistance sensing function which is used to verify that the discharge resistor 22 is within a certain operational range, and a ground connection sensing function which continuously monitors for the connection of the wrist strap to ground.

Figure 3A:
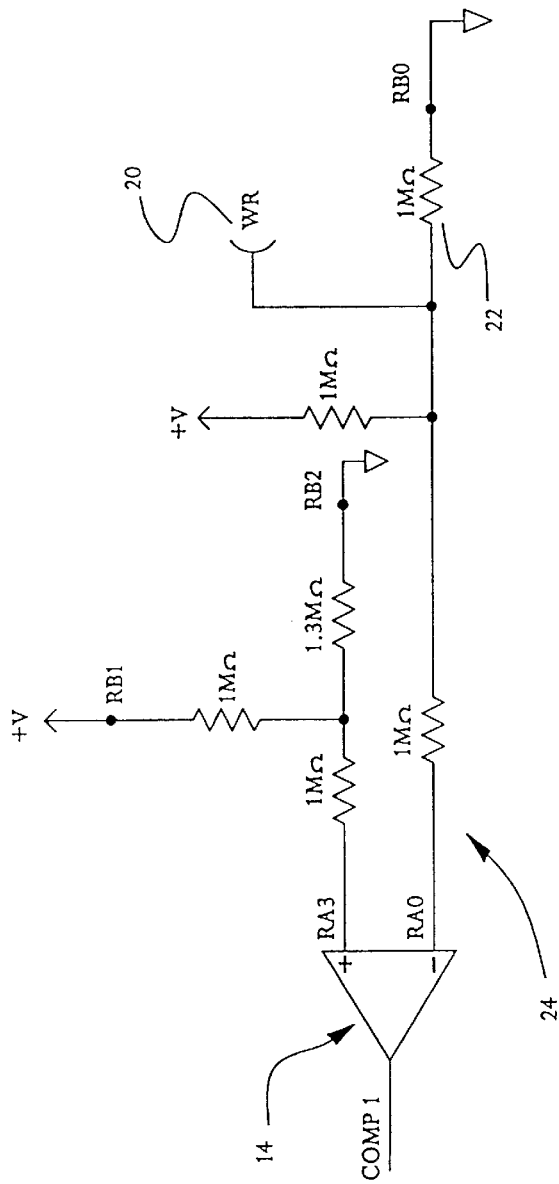
FIG. 3a is an electrical schematic of the discharge resistor check circuit of the sensor circuitry shown in FIG. 2, illustrating the high limit check sequence of the discharge resistor check circuit.
Figure 3B:
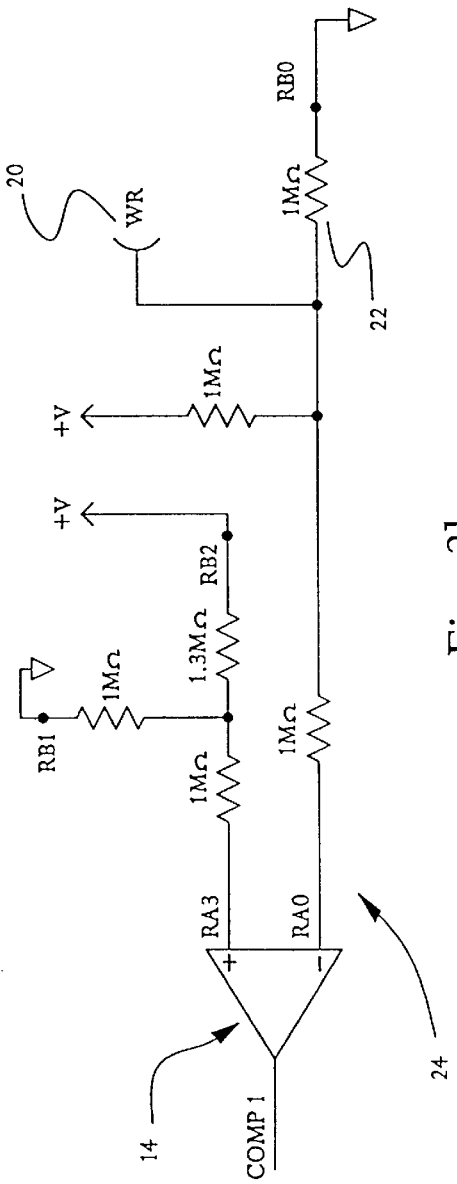
FIG. 3b is an electrical schematic of the discharge resistor check circuit of the sensor circuitry shown in FIG. 2, illustrating the low limit check sequence of the discharge resistor check circuit.

Referring now to FIGS. 3a and 3b, there is schematically illustrated a discharge resistor check circuit 24 of the sensor circuit 18 for monitoring the accuracy of the discharge resistor 22. The discharge resistor check circuit 24 is configured to perform a high limit check of the discharge resistor 22 (FIG. 3a) and a low limit check of the discharge resistor 22 (FIG. 3b). The discharge resistor 22 is checked by the discharge resistor check circuit 24 upon power up of the tag and before each transmission cycle of data from the tag to the interrogator unit. The accuracy of the discharge resistor 22 is intended to be in the range of 1 Megohm +/−30% (i.e., 700 Kohms to 1.3 Megohms). The discharge resistor check circuit 24 is configured to generate a discharge resistor signal corresponding to the sensed accuracy of the discharge resistor 22. As will be discussed in more detail below, a discharge resistor signal which indicates a failure of the discharge resistor 22 will cause a unique fault tone to be generated by the tag. The discharge resistor signal generated by the discharge resistor check circuit 24 is transmitted to the interrogator unit during each transmission cycle of the tag.

Figure 4:
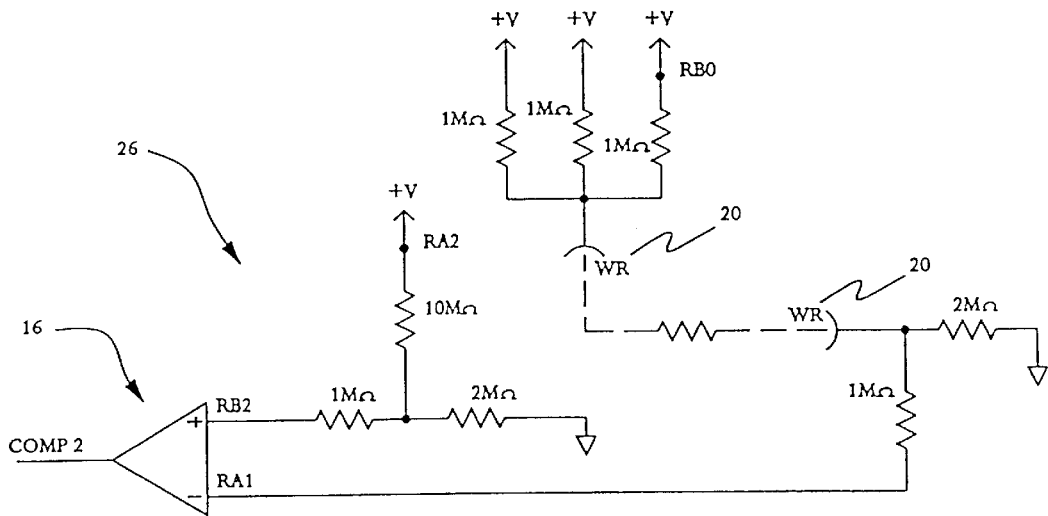
FIG. 4 is an electrical schematic of the skin resistance check circuit of the sensor circuitry shown in FIG. 2.

Referring now to FIG. 4, the sensor circuit 18 of the electronic circuitry 10 further includes a skin resistance check circuit 26 for monitoring the electrical connection of the wrist strap to the user, and more particularly the contact between the electrodes 20 and the user's skin surface. In the preferred embodiment, the user's skin resistance is tested several times by the skin resistance check circuit 26 upon the power up of the tag, and before each transmission cycle of data from the tag to the interrogator unit. The skin resistance check circuit 26 is used to verify that there is a low resistance connection (i.e., greater than 8 Megohms) from the wrist strap to the user, and more particularly between the electrodes 20 and the user's skin.

The skin resistance check circuit 26 is itself configured to generate a skin resistance signal. A skin resistance signal corresponding to at least one, and preferably several readings by the skin resistance check circuit 26 which are above 8 Megohms will trigger the generation of a unique fault tone by the tag to alert the user. The skin resistance signal generated by the skin resistance check circuit 26 is also transmitted to the interrogator unit during each transmission cycle of the tag.

Figure 5:
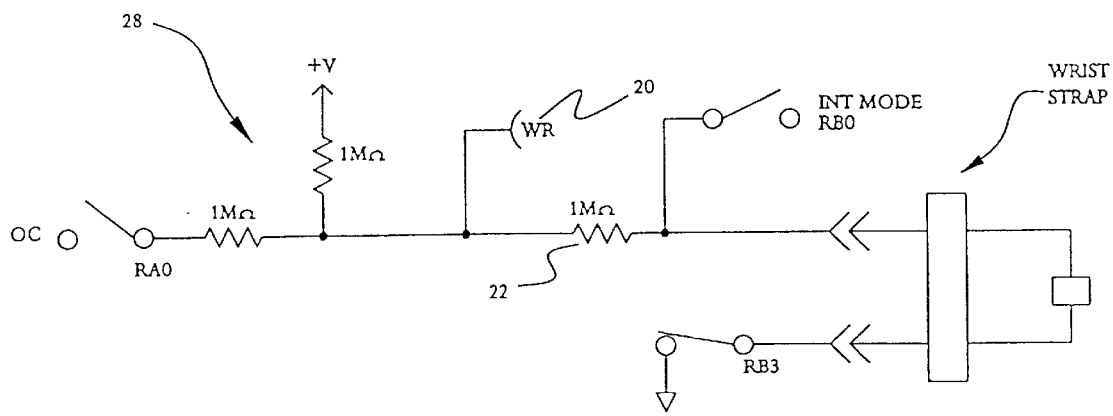
FIG. 5 is an electrical schematic of the ground fault detect circuit of the sensor circuitry shown in FIG. 2.

Referring now to FIG. 5, in addition to the discharge resistor check circuit 24 and skin resistance check circuit 26, the sensor circuit 18 of the electronic circuitry 10 includes a ground fault detect circuit 28 for monitoring the electrical connection of the wrist strap to ground. The path from the wrist strap to ground is tested upon the power up the tag, with the ground condition thereafter being continuously monitored by the ground fault detect circuit 28 which is configured to generate a ground fault signal. A ground fault signal corresponding to a passing condition for all power up tests of the tag triggers the generation of a unique tone by the tag. Additionally, a ground fault signal corresponding to a ground fault or interrupt will trigger the generation of a unique fault tone by the tag and will further immediately force the tag in a transmit mode to the interrogator unit. Otherwise, under normal operating conditions, the ground fault signal will be transmitted to the interrogator unit along with the discharge resistor and skin resistance signals during a regular data transmission cycle of the tag.

In the preferred embodiment, the electronic circuitry 10 incorporated into the tag further comprises a transmission circuit for transmitting the discharge resistor, skin resistance and ground fault signals to the interrogator unit. As previously indicated, the transmission circuit is configured to transmit the discharge resistor, skin resistance, and ground fault signals via a direct sequence spread spectrum having a data rate of approximately 33.33 kbps. All data is differently encoded. The transmission of the discharge resistor, skin resistance, and ground fault signals by the transmission circuit to the interrogator unit preferably occurs via a carrier frequency of approximately 2414 Mhz +/−1 Mhz.

As also previously indicated, the transmission circuit is configured to transmit the discharge resistor, skin resistance, and ground fault signals to the interrogator unit at selected transmission cycles. Each transmission cycle comprises approximately five repetitions of the signals, with each repetition being separated by a random interval of approximately three seconds. The transmission cycles preferably occur at random intervals of approximately five minutes. However, in the event an interrupt within the electrical connection of the wrist strap to ground is monitored by the ground fault detect circuit 28, the transmission circuit is configured to immediately transmit the corresponding ground fault signal to the interrogator unit. The transmission circuit may also be configured such that the discharge resistor and skin resistance signals are also immediately transmitted to the interrogator unit upon the occurrence of a change in condition of the discharge resistor 22 and/or the contact between the electrodes 20 and the user's skin.

In the preferred embodiment, the discharge resistor circuit 24 of the sensor circuit 18 is configured to periodically monitor the accuracy of the discharge resistor 22. Similarly, the skin resistance check circuit 26 is configured to periodically monitor the electrical connection of the wrist strap to the user. However, the ground fault detect circuit 28 is itself configured to continuously monitor the electrical connection of the wrist strap to ground. The accuracy of the discharge resistor 22 and the integrity of the electrical connection of the wrist strap to the user is performed when the ground is first connected, upon power up of the tag (if the ground is connected), and approximately every five minutes when the wrist strap is not being worn.

As previously indicated, the discharge resistor, skin resistance and ground default signals are transmitted by the transmission circuit to the interrogator unit upon the power up of the tag and during each transmission cycle of the tag which preferably occurs approximately every five minutes (with a random interval). Additionally, these signals are transmitted by the transmission circuit to the interrogator unit when the ground is connected or disconnected, with the ground fault signal immediately being transmitted to the interrogator unit upon the occurrence of any interrupt within the electrical connection of the wrist strap to ground. The transmission cycles of the various signals to the interrogator unit acts as a type of confidence signal and is useful for determining the presence or absence of a tag and for determining that the tag is operating satisfactorily (e.g., that the battery is functioning properly).

The electronic circuitry 10 of the present invention further preferably comprises an alarm circuit for generating a audible alarm in response to certain conditions sensed by the discharge resistor check circuit 24, skin resistance check circuit 26, and ground fault detect circuit 28. In this respect, the alarm circuit is configured to generate an audible alarm when the accuracy of the discharge resistor 22 as monitored by the discharge resistor check circuit 24 is outside the range of approximately 1 Megohm +/−30%. The alarm circuit is also configured to generate an audible alarm when at least one reading (and preferably several readings) of the user's skin resistance as monitored by the skin resistance check circuit 26 is above 8 Megohms. The alarm circuit is further configured to generate an audible alarm when a ground fault condition is monitored by the ground fault detect circuit 28.

With particular regard to the audible alarms generated by the alarm circuit of the electronic circuitry 10, a "happy tone" is generated immediately following the ground connect if the various sensor checks facilitated by the discharge resistor check circuit 24, skin resistance check circuit 26, and ground fault detect circuit 28 are within desired parameters. The "happy tone" will also be generated if the sensor checks are within the desired parameters immediately upon power up of the tag (if the ground is present). A "sad tone" will be generated by the alarm circuit if the ground is lost, if the discharge resistor 22 is high, or if the discharge resistor 22 is low. The various states of the switches incorporated into the sensor circuit 18 during the different test phases thereof are summarized in FIG. 6.

In addition to the discharge resistor 22 of the sensor circuit 18, the electronic circuitry 10 incorporated into the tag includes an RF oscillator and a signal transmitter. The electronic circuitry 10 also includes a testing circuit which is incorporated into the microprocessor 12 and is configured to check the frequency of the oscillator, monitor the spectrum of a signal transmitted by the signal transmitter, check the functionality of the ground fault detect circuit 28, check the high and low limits of the discharge resistor 22, and check the functionality of the skin resistance check circuit 26. In the preferred embodiment, the application of a proper voltage to the microprocessor 12 activates the testing circuit of the electronic circuitry 10 and initiates the test mode. The test mode is preferably conducted subsequent to the placement of the tag into a particular test fixture, the components and related functions of which are summarized in the table shown in FIG. 7.

When activated, the testing circuit of the electronic circuitry 10 conducts a first test which is adapted to tune and test the RF oscillator of the tag. During the performance of the first test, the RF oscillator is caused to generate a continuous sequence for allowing the frequency of the oscillator to be checked and properly tuned. The continuous sequence preferably comprises a 2.414 GHz +/−20 kHz signal at 0 dBm having a 1s modulation. A spectrum analyzer should display the 2.414 GHz +/−20 kHz signal at 0 dBm. If the signal is off in frequency, the oscillator frequency is adjusted until such time as the proper frequency is achieved.

Subsequent to the completion of the first test, pressing the Test Switch button of the test fixture will call up a second test performed by the testing circuit wherein the signal transmitter is caused to transmit a signal to allow the spectrum of the signal to be monitored. The signal transmitted by the signal transmitter is preferably a direct sequence spread spectrum (DSSS) signal having a main lobe of a width of approximately 1 MHz. As such, the second test checks the spreading function of the tag, with two beeps from the Buzzer of the test fixture indicating that the second test has been initiated. The spread spectrum signal transmitted by the signal transmitter is displayed on the spectrum analyzer which is used to verify that the main lobe is 1 MHz wide.

Subsequent to the completion of the second test, the Test Switch is pressed again to advance the testing circuit of the electronic circuitry 10 to a third test wherein the ground fault detect circuit 28 is enabled to monitor the response of the tag to ground and no ground. Three beeps from the Buzzer of the test fixture indicate that the third test has been initiated. In the third test, an audio plug is preferably connected to an audio jack attached to the tag. During the performance of the third test, the actuation of the Ground Test Switch of the test fixture to the open position should facilitate the generation of a "sad" tone from the Buzzer thereof. Conversely, the actuation of the Ground Test Switch to the closed position should facilitate the generation of a "happy" tone from the Buzzer. Upon the completion of the third test, the Ground Test Switch is left in the open position.

Subsequent to the completion of the third test, the Test Switch button of the test fixture is again pressed to advance the testing circuit to a fourth test wherein the discharge resistor check circuit 24 is enabled to allow the low limit of the discharge resistor 22 to be checked. The low limit of the discharge resistor 22 is preferably approximately 700 kohm. Four beeps from the Buzzer of the test fixture indicate that the fourth test has been initiated. During the performance of the fourth test, the Discharge Test Switch of the test fixture should initially be actuated to a 1 Megohm (open) position. When the Discharge Test Switch is actuated to the open position, "happy" tones should be generated by the Buzzer of the test fixture. Actuating the Discharge Test Switch to a 500 kohm (closed) position should change the audible output of the Buzzer to "sad" tones. Upon completion of the fourth test, the Discharge Test Switch is returned to the 1 Megohm (open) position to accommodate subsequent tests.

Subsequent to the completion of the fourth test, the Test Switch of the test fixture is pressed to cause the testing circuit within the microprocessor 12 to advance to a fifth test wherein the discharge resistor check circuit 24 is again enabled to allow the high limit of the discharge resistor 22 to be checked. The high limit of the discharge resistor 22 is preferably approximately 1.3 Megohm. During the performance of the fifth test, the Discharge Test Switch is initially in the 1 Megohm (open) position which, as in the fourth test, causes "happy" tones to be generated by the Buzzer of the test fixture. Actuating the Discharge Test Switch to a 1.5 Megohm (closed) position should change the audible output of the Buzzer to "sad" tones. Upon the completion of the fifth test, the Discharge Test Switch is again actuated back to the 1 Megohm (open) position.

Subsequent to the completion of the fifth test, the Test Switch button of the test fixture is again pressed to advance the testing circuit of the electronic circuitry 10 to a sixth test wherein the skin resistance check circuit 26 is enabled to allow a maximum skin resistance detect to be tested. The maximum skin resistance detect is approximately 8 Megohm. Five beeps generated by the Buzzer indicate that the sixth test has been initiated. During the performance of the sixth test, the Wrist Test Switch should be in an 6 Megohm position, which should produce "happy" tones from the Buzzer of the test fixture. Actuating the Wrist Test Switch to a 12 Megohm position increases the simulated wrist resistance to 12 Megohm which is beyond the specified limit of 8 Megohm and should cause the generation of "sad" tones from the Buzzer of the test fixture. Upon the completion of the sixth test, the Wrist Test Switch is returned to its 6 Megohm position.

In the production versions of the tag incorporating the electronic circuitry 10 of the present invention, it is contemplated that the test fixture will connect directly to a computer interface. As such, instead of the Buzzer of the test fixture indicating the status of each sensor/test, the Buzzer output line will go directly to a computer, wherein the signal transmitted through that line will contain the sensor status. This particular configuration will enable automation of the entire test process for the tag. As previously indicated, automation of the test sequence allows for quick testing of the tag without all of the mechanical interfaces and complicated test fixtures that may require operators to run the tests. The automation of the test for production also enables quick testing of the tag once it is assembled.

As also previously indicated, the order of the tests conducted by the testing circuit of the electronic circuitry 10 is subject to change, with the previously described order of the test mode constituting only one possible embodiment. In the electronic circuitry 10, the previously described test modes are operated by the microprocessor 12, with the pulsing of the RB 7 pin on the microprocessor 12 high for greater than 50 mS being operable to cycle the microprocessor 12 through the tests. As previously explained, the pass/fail status of the tests may be determined through the various different audible indications emitted by the piezoelectric Buzzer of the test fixture.

As explained above, the tags incorporating the electronic circuitry 10 of the present invention are adapted to be able to transmit the discharge resistor, skin resistance, and ground fault signals to the interrogator unit. It is contemplated that the electronic circuitry 10 may be integrated into a universal tagging and locating system which will allow any tag to talk to any interrogator unit. Certain systems may also be provided to support encryption to allow security if needed. As also previously indicated, the tag, and more particularly the transmission circuit of the electronic circuitry 10, transmits identifying information from the tag to the interrogator unit, as well as the various signals corresponding to the status of the sensors of the tag. Additionally, data may be transmitted to the interrogator unit corresponding to the number of transmission cycles which have been executed by the tag subsequent to its activation. During a transmission of data from the tag, the interrogator unit will receive the tag signal and store the information for later processing.

Additional modifications and improvements of the present invention may also be apparent to those of ordinary skill in the art. Thus, the particular combination of parts described and illustrated herein is intended to represent only one embodiment of the present invention, and is not intended to serve as limitations of alternative devices within the spirit and scope of the invention.

What is claimed is:

1. In a static electrical discharge dissipation system having a dissipation device which is worn by a user and a conductive line for electrically connecting the dissipation device to ground, the improvement comprising a communication device including electronic circuitry which electrically communicates with the dissipation device and the conductive line, and is operable to monitor the electrical connection of the dissipation device to ground and test the functionality of the communication device, the electronic circuitry of the communication device including:

an oscillator for generating electronic circuitry timing signals;

a discharge resistor for preventing a direct short to ground when the user contacts an active electrical conductor;

a signal transmitter for transmitting signals representative of the functionality of the electronic circuitry, the dissipation device, and the conductive line;

a discharge resistor check circuit for monitoring the accuracy of the discharge resistor;

a skin resistance check circuit for monitoring the electrical connection of the dissipation device to the user;

a ground fault detect circuit for monitoring the electrical connection of the dissipation device to ground; and a testing circuit for checking the frequency of the oscillator, monitoring the spectrum of the signal transmitted by the signal transmitter, checking the functionality of the ground fault detect circuit, checking a low limit of the discharge resistor, checking a high limit of the discharge resistor, and checking the functionality of the skin resistance check circuit.

2. The electronic circuitry of claim 1 wherein said discharge resistor check circuit is configured to perform a high limit check of the discharge resistor and a low limit of the discharge resistor.

3. The electronic circuitry of claim 2 wherein said testing circuit is configured to conduct a series of tests, including:

a first test where the oscillator is caused to generate a continuous sequence for allowing the frequency of the oscillator to be checked and properly tuned;

a second test wherein the signal transmitter is caused to transmit a signal to allow the spectrum of the signal to be monitored;

a third test wherein the ground fault detect circuit is enabled to monitor the response of the tag to ground and no ground;

a fourth test wherein the discharge resistor check circuit is enabled to allow the low limit of the discharge resistor to be checked;

a fifth test wherein the discharge resistor check circuit is enabled to allow the high limit of the discharge resistor to be checked; and a sixth test wherein the skin resistance check circuit is enabled to allow a maximum skin resistance detect to be tested.

4. The electronic circuitry of claim 3 wherein the continuous sequence comprises a 2.414 GHz +/−20 kHz signal at 0 dBm having a 1s modulation.

5. The electronic circuitry of claim 3 wherein the signal transmitted by the signal transmitter is a direct sequence spread spectrum signal having a main lobe of a width of approximately 1 MHz.

6. The electronic circuitry of claim 3 wherein the low limit of the discharge resistor is approximately 700 kohm.

7. The electronic circuitry of claim 3 wherein the high limit of the discharge resistor is approximately 1.3 Megohm.

8. The electronic circuitry of claim 3 wherein the maximum skin resistance detect is approximately 8 Megohm.

9. The electronic circuitry of claim 1 wherein the dissipation device comprises a static wrist strap having the communication device attached thereto.

10. The electronic circuitry of claim 1 wherein the discharge resistor check circuit, the skin resistance check circuit, and the ground fault detect circuit are each integrated into a sensor circuit of the electronic circuitry.

11. The electronic circuitry of claim 10 wherein the sensor circuit is incorporated into a microprocessor of the electronic circuitry.

12. The electronic circuitry of claim 11 wherein the testing circuit is incorporated into the microprocessor.

13. The electronic circuitry of claim 1 wherein the communication device into which the electronic circuitry is incorporated comprises a transmitter.

14. The electronic circuitry of claim 1 wherein the communication device into which the electronic circuitry is incorporated comprises a transceiver.

15. In a static electrical discharge dissipation system having a dissipation device which is worn by a user and a conductive line for electrically connecting the dissipation device to ground, a method for monitoring the electrical connection of the dissipation device to ground and testing the functionality of the dissipation device, comprising the steps of:

(a) providing a communication device including electronic circuitry which electrically communicates with the dissipation device and the conductive line, and has a discharge resistor for preventing a direct short to ground when the user contacts an active electrical conductor, a signal transmitter for transmitting signals representative of the functionality of the electronic circuitry, the dissipation device, and the conductive line, and an oscillator for generating electronic circuitry timing signals;

(b) monitoring the accuracy of the discharge resistor via a discharge resistor check circuit of the electronic circuitry;

(c) monitoring the electrical connection of the dissipation device to the user via a skin resistance check circuit of the electronic circuitry;

(d) monitoring the electrical connection of the dissipation device to ground via a ground fault detect circuit of the electronic circuitry;

(e) checking the frequency of the oscillator via a testing circuit of the electronic circuitry;

(f) monitoring the spectrum of the signal transmitted by the signal transmitter via the testing circuit;

(g) checking the functionality of the ground fault detect circuit via the testing circuit;

(h) checking a low limit of the discharge resistor via the testing circuit;

(i) checking a high limit of the discharge resistor via the testing circuit; and (j) checking the functionality of the skin resistance check circuit via the testing circuit.

16. The method of claim 15 wherein step (b) comprises performing a high limit check of the discharge resistor and a low limit check of the discharge resistor.

17. The method of claim 15 wherein step (e) comprises causing the oscillator to generate a continuous sequence for allowing the frequency of the oscillator to be checked and properly tuned.

18. The method of claim 17 wherein step (e) comprises causing the oscillator to generate a 2.414 GHz +/−20 kHz signal at 0 dBm having a 1s modulation.

19. The method of claim 15 wherein step (f) comprises causing the signal transmitter to transmit a signal to allow the spectrum of the signal to be monitored.

20. The method of claim 19 wherein step (f) comprises causing the signal transmitter to transmit a direct sequence spread spectrum signal having a main lobe of a width of approximately 1 MHz.

21. The method of claim 15 wherein step (g) comprises enabling the ground fault detect circuit to monitor the response of the communication device to ground and no ground.

22. The method of claim 16 wherein step (h) comprises enabling the discharge resistor check circuit to allow the low limit of the discharge resistor to be checked.

23. The method of claim 22 wherein step (a) comprises providing the discharge resistor with the low limit of approximately 700 kohm.

24. The method of claim 16 wherein step (i) comprises enabling the discharge resistor check circuit to allow the high limit of the discharge resistor to be checked.

25. The method of claim 24 wherein step (a) comprises providing the discharge resistor with the high limit of approximately 1.3 Megohm.

26. The method of claim 15 wherein step (j) comprises enabling the skin resistance check circuit to allow a maximum skin resistance detect to be tested.

27. The method of claim 26 wherein step (j) comprises providing the maximum skin resistance detect as approximately 8 Megohm.

\* \* \* \* \*